United States Patent
Huang

(10) Patent No.: US 10,276,832 B2
(45) Date of Patent: Apr. 30, 2019

(54) OLED DISPLAY AND MANUFACTURING METHOD THEREOF

(71) Applicant: Wuhan China Star Optoelectronics Technology Co., Ltd., Wuhan (CN)

(72) Inventor: Jing Huang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 38 days.

(21) Appl. No.: 15/509,194

(22) PCT Filed: Dec. 27, 2016

(86) PCT No.: PCT/CN2016/112250
§ 371 (c)(1),
(2) Date: Mar. 7, 2017

(87) PCT Pub. No.: WO2018/094801
PCT Pub. Date: May 31, 2018

(65) Prior Publication Data
US 2018/0241003 A1     Aug. 23, 2018

(30) Foreign Application Priority Data

Nov. 28, 2016 (CN) .......................... 2016 1 1069717

(51) Int. Cl.
*H01L 51/52* (2006.01)
*H01L 51/56* (2006.01)
*H01L 27/32* (2006.01)

(52) U.S. Cl.
CPC ...... *H01L 51/5259* (2013.01); *H01L 51/5275* (2013.01); *H01L 51/56* (2013.01);
(Continued)

(58) Field of Classification Search
CPC combination set(s) only.
See application file for complete search history.

(56) References Cited

U.S. PATENT DOCUMENTS 7,902,748 B2 * 3/2011 Cok ................. B82Y 20/00
                                                    313/506
2007/0030570 A1 * 2/2007 Jacobowitz ...... B29D 11/00365
                                                    359/626
(Continued)

FOREIGN PATENT DOCUMENTS

| CN | 1719955 A | 1/2006 | |
|---|---|---|---|
| CN | 102376742 A | 3/2012 | |
| CN | 102590901 A * | 7/2012 | ............... G02B 3/00 |

*Primary Examiner* — Michael Lebentritt
*Assistant Examiner* — Jordan M Klein
(74) *Attorney, Agent, or Firm* — Leong C. Lei

(57) ABSTRACT

The invention provides an OLED and manufacturing method thereof. The manufacturing method adds a hydrophobic thin film in the TFE structure of the OLED device, prints the microlens material droplets onto hydrophobic thin film, and cures to form a microlens array comprising microlenses arranged in an array. The method is simple, and can use existing packaging equipment. Moreover, the contact angle of the microlens formed by curing the printed microlens material droplets on the hydrophobic thin film is large to enhance the optical coupling efficiency of the microlens array, as well as light-emission efficiency of OLED device. The present invention provides an OLED display device by adding a hydrophobic thin film in the TFE structure of the OLED device, and forming a microlens array layer comprising microlenses arranged in an array to enhance light-emission efficiency of OLED device.

13 Claims, 6 Drawing Sheets

(52) U.S. Cl.
    CPC ...... *H01L 27/3244* (2013.01); *H01L 51/5253* (2013.01); *H01L 51/5256* (2013.01); *H01L 2251/56* (2013.01)

(56) References Cited

U.S. PATENT DOCUMENTS

| | | | | |
|---|---|---|---|---|
| 2007/0217019 | A1* | 9/2007 | Huang | G02B 3/0031 359/642 |
| 2007/0252155 | A1* | 11/2007 | Cok | H01L 51/5203 257/79 |
| 2008/0297045 | A1* | 12/2008 | Cok | B82Y 20/00 313/506 |
| 2010/0224313 | A1* | 9/2010 | Chari | B29D 11/00365 156/242 |
| 2012/0074836 | A1* | 3/2012 | Piquette | H01L 33/44 313/501 |
| 2014/0034919 | A1* | 2/2014 | Park | H01L 51/5275 257/40 |
| 2014/0063854 | A1* | 3/2014 | Park | G02B 6/0065 362/619 |
| 2015/0048331 | A1* | 2/2015 | Kwack | H01L 51/5253 257/40 |

\* cited by examiner

OLED DISPLAY AND MANUFACTURING METHOD THEREOF

BACKGROUND OF THE INVENTION

1. Field of the Invention

The present invention relates to the field of display techniques, and in particular to an OLED display and manufacturing method thereof.

2. The Related Arts

The organic light emitting diode (OLED) display is a flat panel display device and provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

An OLED device typically comprises a substrate, an anode provided on the substrate, a hole injection layer (HIL) provided on the anode, a hole transport layer (HTL) provided on the hole injection layer, a light-emitting layer (EML) provided on the hole transport layer, an electron transport layer (ETL) provided on the light-emitting layer, an electron injection layer (EIL) provided on the electron transport layer, and a cathode provided on the electron transport layer. The theory of light-emission of OLED display the carrier injection and recombination for the semiconductor materials and organic light-emitting materials under the driving of the electric field. Specifically, the OLED display device usually adopts the ITO pixel electrode and the metal electrode as the anode and the cathode. Under the driving of a certain voltage, the electron and the hole are respectively injected from the cathode and the anode into the electron transport layer and the hole transport layer respectively; and the electrons and the holes migrate through the electron transport layer and the hole transport layer respectively to the light-emitting layer to meet in the light emitting layer to form excitons and to excite the light-emitting molecules, which in turn emit visible light by radiation relaxation.

After the preparation of OLED devices, to prevent the humidity and oxygen intrusion into the device from the external environment to affect the lifespan, the OLED devices usually must be packaged. One of the most common OLED packaging technologies is the thin film encapsulation (TFE), wherein an inorganic/organic alternating growth approach is used to form an encapsulation layer of OLED device. The inorganic thin film can be prepared by plasma enhanced chemical vapor deposition (PECVD), atomic layer deposition (ALD), sputtering, pulsing laser deposition (PLD), and other processes.

With the continuous development of new materials and new technology, the theoretic quantum efficiency of the OLED has reaching 100%, but the optical coupling efficiency is still low. Because of the difference in refractive index among the substrate, the organic layer and the encapsulation layer, the luminous flux emitted by the OLED mainly has three directions: waveguide mode, substrate mode and air mode; and only about 20% of light energy is emitted to the outside the device. To improve the optical coupling efficiency of OLEDs, a microlens array structure is usually added to the interface between the substrate and the air to reduce the loss of the flux due to the substrate mode. The results show that the optical coupling efficiency of the OLED can be increased by about 50%. The optical calculation results also show that when the refractive indexes of the hemispherical microprism material and the substrate match, the optical coupling efficiency can be increased by 45%. The hemispherical microlens array is usually prepared by a photo-resist hot-melt process or an etching process, but these processes are usually complex, and material selection is limited.

SUMMARY OF THE INVENTION

The object of the present invention is to provide a manufacturing method for OLED display, to effectively improve the light-emission efficiency of OLED device.

Another object of the present invention is to provide an OLED display, with OLED device having higher light-emission efficiency.

To achieve the above object, the present invention provides a manufacturing method for OLED display, which comprises the steps of:

Step 1: providing an OLED substrate, the OLED substrate comprising: a base substrate, a thin film transistor (TFT) layer disposed on the base substrate, and an OLED device disposed on the TFT layer;

forming a first inorganic layer on the OLED device and the TFT layer, forming a first organic layer on the first inorganic layer, and forming a second inorganic layer on the first organic layer;

Step 2: forming a hydrophobic thin film on the second inorganic layer, and forming a microlens array on the hydrophobic thin film.

According to a preferred embodiment of the present invention, the material for the hydrophobic thin film comprises polytetrafluoroethylene; the hydrophobic thin film has a thickness of 10 nm to 1000 nm; and in the step 2, a pulsed laser deposition apparatus is used to form the hydrophobic thin film.

According to a preferred embodiment of the present invention, the microlens array comprises a plurality of microlenses arranged in an array, the microlens has a spherical or ellipsoidal shape; the material for the microlens comprises polycarbonate;

in Step 2, an ink-jet printing apparatus is used to print a plurality of microlens material droplets arranged in an array on the hydrophobic thin film, the droplets are cured to form a plurality of microlenses to form the microlens array.

Preferably, the manufacturing method for OLED display further comprises: Step 3: forming a third inorganic layer on the microlens array and the hydrophobic thin film.

Preferably, the manufacturing method for OLED display further comprises: Step 4: forming a plurality of second organic layers and a plurality of fourth inorganic layers on the third inorganic layer;

the plurality of second organic layers and the plurality of fourth inorganic layers being disposed alternatingly and the layer contacting the third inorganic layer being a second organic layer;

the material for the first inorganic layer, the second inorganic layer, the third inorganic layer and the fourth inorganic layer comprising at least one of silicon nitride, silicon oxide, and aluminum oxide;

the first inorganic layer, the second inorganic layer, the third inorganic layer and the fourth inorganic layer having a thickness of 1 μm-2 μm;

the first organic layer and the second organic layer having a thickness of 1 μm-10 μm.

Another embodiment of the present invention provides an OLED display, which comprises: a base substrate, a thin film transistor (TFT) layer disposed on the base substrate, and an OLED device disposed on the TFT layer; a first inorganic layer disposed on the OLED device and the TFT layer, a first organic layer disposed on the first inorganic layer, a second inorganic layer disposed on the first organic layer, a hydrophobic thin film disposed on the second inorganic layer, and a microlens array disposed on the hydrophobic thin film.

According to a preferred embodiment of the present invention, material for the hydrophobic thin film comprises polytetrafluoroethylene; the hydrophobic thin film has a thickness of 10 nm to 1000 nm.

According to a preferred embodiment of the present invention, the microlens array comprises a plurality of microlenses arranged in an array, the microlens has a spherical or ellipsoidal shape; the material for the microlens comprises polycarbonate.

Preferably, the OLED display further comprises: a third inorganic layer disposed on the microlens array and the hydrophobic thin film.

Preferably, the OLED display further comprises: a plurality of second organic layers and a plurality of fourth inorganic layers disposed on the a third inorganic layer; the plurality of second organic layers and the plurality of fourth inorganic layers being disposed alternatingly and the layer contacting the third inorganic layer being a second organic layer;

the material for the first inorganic layer, the second inorganic layer, the third inorganic layer and the fourth inorganic layer comprising at least one of silicon nitride, silicon oxide, and aluminum oxide;

the first inorganic layer, the second inorganic layer, the third inorganic layer and the fourth inorganic layer having a thickness of 1 μm-2 μm;

the first organic layer and the second organic layer having a thickness of 1 μm-10 μm.

Yet another embodiment of the present invention provides a manufacturing method for OLED display, which comprises the steps of:

Step 1: providing an OLED substrate, the OLED substrate comprising: a base substrate, a thin film transistor (TFT) layer disposed on the base substrate, and an OLED device disposed on the TFT layer;

forming a first inorganic layer on the OLED device and the TFT layer, forming a first organic layer on the first inorganic layer, and forming a second inorganic layer on the first organic layer;

Step 2: forming a hydrophobic thin film on the second inorganic layer, and forming a microlens array on the hydrophobic thin film;

wherein the material for the hydrophobic thin film comprising polytetrafluoroethylene; the hydrophobic thin film having a thickness of 10 nm to 1000 nm; and in the step 2, a pulsed laser deposition apparatus being used to form the hydrophobic thin film;

wherein the microlens array comprising a plurality of microlenses arranged in an array, the microlens having a spherical or ellipsoidal shape; the material for the microlens comprising polycarbonate;

in Step 2, an ink-jet printing apparatus being used to print a plurality of microlens material droplets arranged in an array on the hydrophobic thin film, the droplets being cured to form a plurality of microlenses to form the microlens array.

Compared to the known techniques, the present invention provides the following advantages. The present invention provides a manufacturing method for OLED display, by adding a hydrophobic thin film in the thin film encapsulation structure of the OLED device, printing the droplets of the microlens material onto the hydrophobic thin film, curing to form a microlens array layer comprising a plurality of microlenses arranged in an array. The method is not only simple, but also can be performed by existing packaging equipment economically. Moreover, the contact angle of the microlens formed by curing the printed microlens material droplets on the hydrophobic thin film is large to enhance the optical coupling efficiency of the microlens array, as well as light-emission efficiency of OLED device. The present invention provides an OLED display device by adding a hydrophobic thin film in the thin film encapsulation structure of the OLED device, and forming a microlens array layer comprising a plurality of microlenses arranged in an array. The contact angle of the microlens formed by curing the printed microlens material droplets on the hydrophobic thin film is large to enhance the optical coupling efficiency of the microlens array, as well as light-emission efficiency of OLED device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
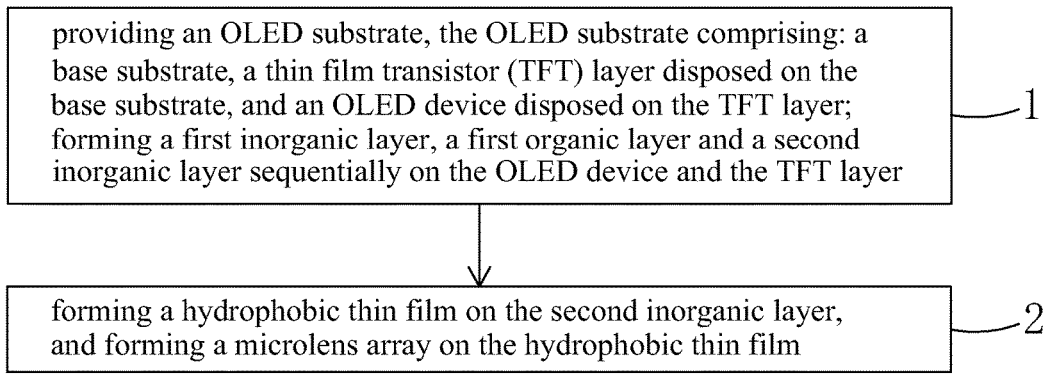
FIG. 1 is a schematic view showing a flowchart of the manufacturing method for OLED display provided by an embodiment of the present invention.
Figure 2:
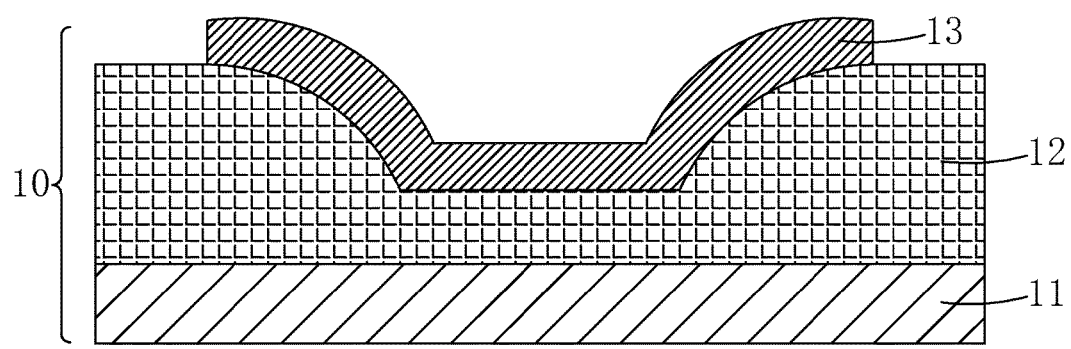
FIG. 2-3 are schematic views showing Step 1 of the manufacturing method for OLED display provided by an embodiment of the present invention.

Referring to FIG. 1, the present invention provides a manufacturing method for OLED display, which comprises the steps of:

Step 1: providing an OLED substrate 10, the OLED substrate 10 comprising: a base substrate 11, a thin film transistor (TFT) layer 12 disposed on the base substrate 11, and an OLED device 13 disposed on the TFT layer 14.

Figure 3:
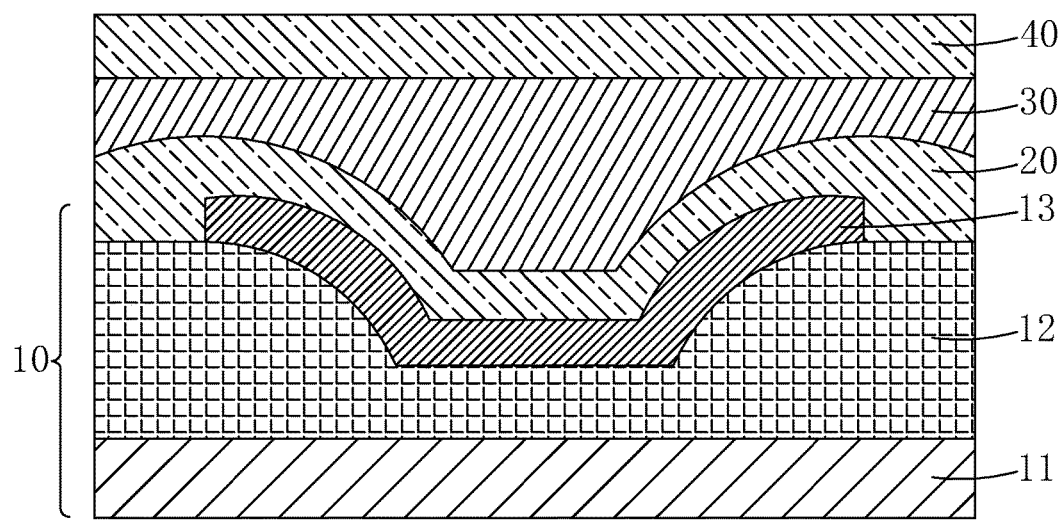

As shown in FIG. 3, forming a first inorganic layer 20 on the OLED device 13 and the TFT layer 12, forming a first organic layer 30 on the first inorganic layer 20, and forming a second inorganic layer 40 on the first organic layer 30.

Preferably, the base substrate is a flexible substrate so that when the subsequent process uses TFE process to package the OLED device 13, the manufactured OLED display is a flexible OLED display.

Specifically, in Step 1, a plasma enhanced chemical vapor deposition (PECVD), atomic layer deposition (ALD), sputtering, or pulsing laser deposition (PLD) apparatus is used to form the first inorganic layer 20 and the second inorganic layer 40.

Specifically, the Step 1, an ink-inject printer (IJP) is used to form the first organic layer 30.

Specifically, the first inorganic layer 20 and the second inorganic layer 40 have a thickness of 1 µm-2 µm, respectively.

Specifically, the material for the first inorganic layer 20 and the second inorganic layer 40 comprises at least one of silicon nitride ($SiN_x$), silicon oxide ($SiO_x$), and aluminum oxide ($Al_2O_3$).

Specifically, the first inorganic layer 20 and the second inorganic layer 40 serve to insulate from the humidity and oxygen.

Specifically, the first organic layer 30 has a thickness of 1 µm-10 µm.

Specifically, the material for the first organic layer 30 comprises at least one of polyacrylamide, polyvinylidene fluoride, polyacrylates, and fluorine-containing acrylic block copolymers.

Specifically, the first organic layer 30 serves to flatten the surface of the OLED substrate 10 and release the stress to realize the flexible display.

Figure 4:
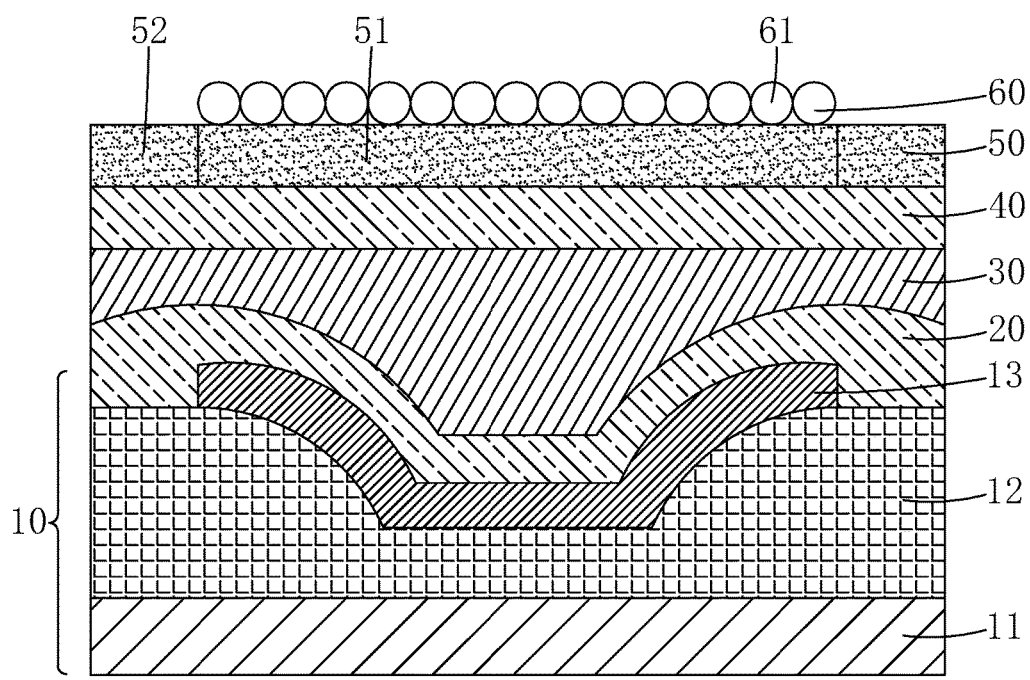
FIG. 4 is a schematic view showing Step 2 of the manufacturing method for OLED display and the structure of the OLED display provided by an embodiment of the present invention.

Step 2: as shown in FIG. 4, forming a hydrophobic thin film 50 on the second inorganic layer 40, and forming a microlens array 60 on the hydrophobic thin film 50.

Preferably, in Step 2, the pulsed laser deposition (PLD) apparatus is used to form the hydrophobic thin film 50.

Preferably, the hydrophobic thin film 50 is an ultra hydrophobic thin film forming a surface contact angle greater than 150° with water.

Preferably, the material for the hydrophobic thin film 50 comprises polytetrafluoroethylene (Teflon).

Specifically, the hydrophobic thin film 50 has a thickness of 10 nm to 1000 nm.

Specifically, the microlens array 60 comprises a plurality of microlenses 61 arranged in an array, the microlens 61 has a spherical or ellipsoidal shape.

Preferably, the material for the microlens 61 comprises polycarbonate (PC).

Preferably, in Step 2, an ink-jet printing (IJP) apparatus is used to print a plurality of microlens material droplets arranged in an array on the hydrophobic thin film 50, and the droplets are cured to form a plurality of microlenses 61 to form the microlens array 60.

Specifically, compared to printing onto other bases, the microlens material droplets printed on the hydrophobic thin film 50 have a greater contact angle. After curing, the formed microlens 61 also has a greater contact angle. The greater contact angle of the microlens 61 provides the better light-focusing effect so that the optical coupling efficiency of the microlens array 60 is improved as well as the light-emission efficiency of the OLED device 13.

Specifically, the hydrophobic thin film 50 comprises a pixel area 51 corresponding to the OLED device 13 and a non-pixel area 52 other than the pixel area. Preferably, the microlens array 60 is formed only on the pixel area 51 of the hydrophobic film 50.

Preferably, the manufacturing method for OLED display further comprises: Step 3: as shown in FIG. 3, forming a third inorganic layer 70 on the microlens array 60 and the hydrophobic thin film 50. Because the third inorganic layer 70 can also serve to insulate from the humidity and oxygen, the third inorganic layer 70 can further protect the microlens array 60 and further improve the encapsulation effect on the OLED device 13.

Specifically, the material for the third inorganic layer 70 comprises at least one of silicon nitride ($SiN_x$), silicon oxide ($SiO_x$), and aluminum oxide ($Al_2O_3$), and the third inorganic layer 70 have a thickness of 1 µm-2 µm.

Specifically, in Step 3, the plasma enhanced chemical vapor deposition (PECVD), atomic layer deposition (ALD), sputtering, or pulsing laser deposition (PLD) apparatus is used to form the third inorganic layer 70.

Figure 6:
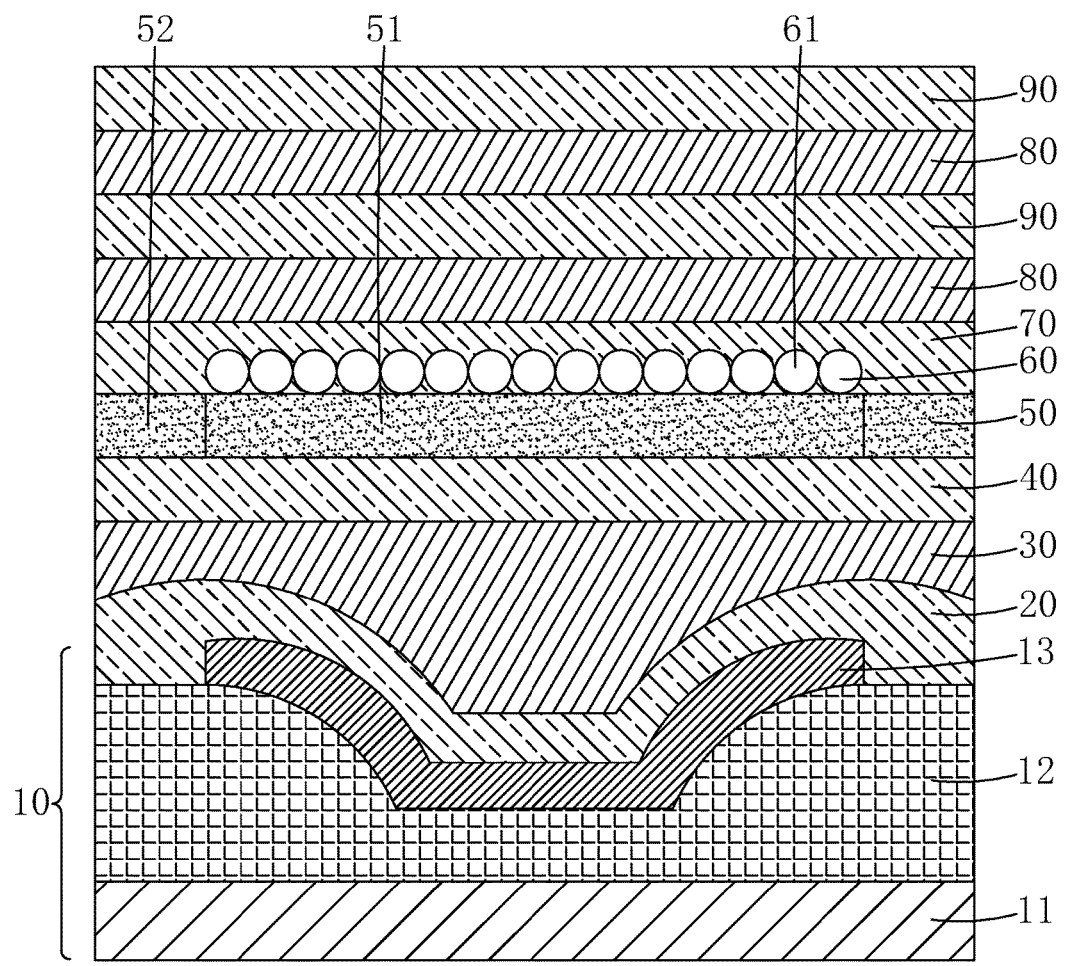
FIG. 6 is a schematic view showing Step 3 of the manufacturing method for OLED display and the structure of another preferred OLED display provided by an embodiment of the present invention.

Preferably, the manufacturing method for OLED display further comprises: Step 4: as shown in FIG. 6, forming a plurality of second organic layers 80 and a plurality of fourth inorganic layers 90 on the a third inorganic layer 70 to further improve the encapsulation effect of the OLED device 13.

The plurality of second organic layers 80 and the plurality of fourth inorganic layers 90 are disposed alternatingly; and the layer contacts the third inorganic layer 70 is a second organic layer 80.

Preferably, in the plurality of second organic layers 80 and the plurality of fourth inorganic layers 90, the outermost layer is a fourth inorganic layer 90.

Specifically, the material for the fourth inorganic layer 90 comprises at least one of silicon nitride ($SiN_x$), silicon oxide ($SiO_x$), and aluminum oxide ($Al_2O_3$), and the fourth inorganic layer 90 have a thickness of 1 µm-2 µm.

Specifically, in Step 4, the plasma enhanced chemical vapor deposition (PECVD), atomic layer deposition (ALD), sputtering, or pulsing laser deposition (PLD) apparatus is used to form the fourth inorganic layer 90.

Specifically, the material for the second organic layer 80 comprises at least one of polyacrylamide, polyvinylidene fluoride, polyacrylates, and fluorine-containing acrylic block copolymers. The second organic layer 80 has a thickness of 1 µm-10 µm.

Specifically, in Step 4, an ink-inject printer (IJP) is used to form the second organic layer 80.

Specifically, the OLED display manufactured by the above manufacturing method is a top-emitting OLED display, wherein the light emitted by the OLED device 13 is from the top, coupled by the microlens array 60, and then emitted from the OLED display. Because the optical coupling efficiency of the microlens array 60 is higher, the light-emission efficiency of the OLED device 13 is also enhanced.

The present invention provides a manufacturing method for OLED display, by adding a hydrophobic thin film 50 in the thin film encapsulation structure of the OLED device 13, printing the droplets of the microlens material onto the hydrophobic thin film 50, curing to form a microlens array 60 comprising a plurality of microlenses 61 arranged in an array. The method is not only simple, but also can be performed by existing packaging equipment economically. Moreover, the contact angle of the microlens 61 formed by curing the printed microlens material droplets on the hydrophobic thin film 50 is large to enhance the optical coupling efficiency of the microlens array 60, as well as light-emission efficiency of OLED device.

Referring to FIG. 4, the present invention also provides an OLED display, which comprises: a base substrate 11, a thin film transistor (TFT) layer 12 disposed on the base substrate 11, and an OLED device 13 disposed on the TFT layer 12; a first inorganic layer 20 disposed on the OLED device 13 and the TFT layer 12, a first organic layer 30 disposed on the first inorganic layer 20, a second inorganic layer 40 disposed on the first organic layer 30, a hydrophobic thin film 50 disposed on the second inorganic layer 40, and a microlens array 60 disposed on the hydrophobic thin film 50.

Figure 5:
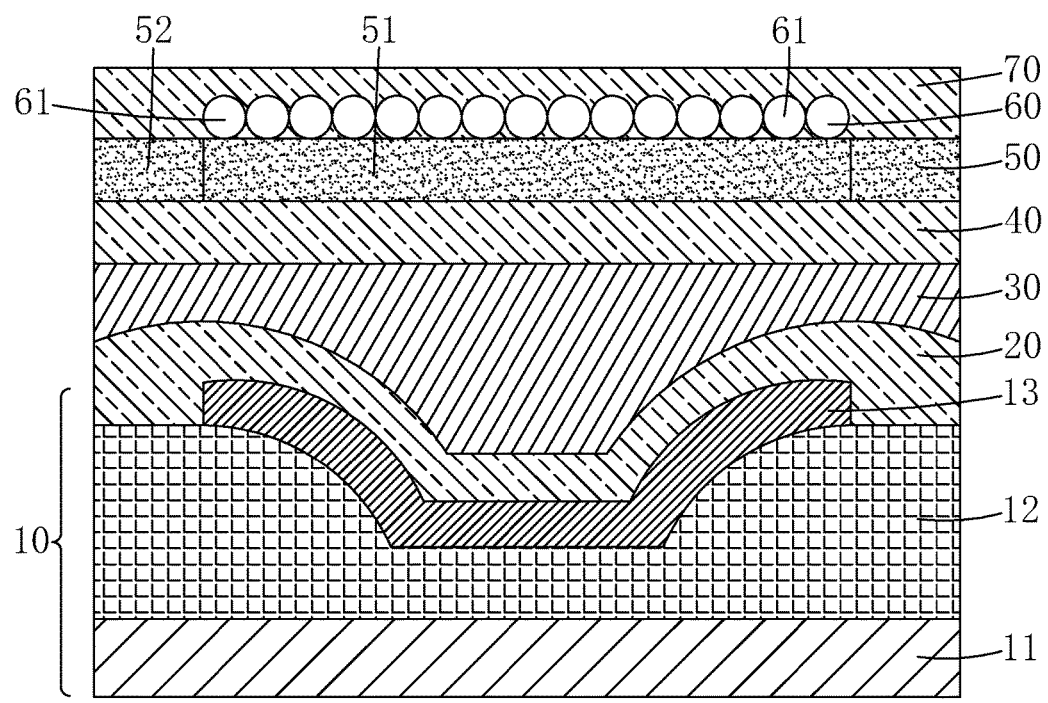
FIG. 5 is a schematic view showing Step 3 of the manufacturing method for OLED display and the structure of a preferred OLED display provided by an embodiment of the present invention.

Preferably, as shown in FIG. 5, the OLED display further comprises: a third inorganic layer 70 disposed on the microlens array 60 and the hydrophobic thin film 50.

Preferably, as shown in FIG. 6, the OLED display further comprises: a plurality of second organic layers 80 and a plurality of fourth inorganic layers 90 disposed on the a third inorganic layer 70.

The plurality of second organic layers 80 and the plurality of fourth inorganic layers 90 are disposed alternatingly and the layer contacts the third inorganic layer 70 is a second organic layer 80.

Preferably, in the plurality of second organic layers 80 and the plurality of fourth inorganic layers 90, the outermost layer is a fourth inorganic layer 90.

Preferably, the base substrate is a flexible substrate, and the OLED display is a flexible OLED display.

Specifically, the OLED display is a top-emitting OLED display.

Specifically, the first inorganic layer 20, the second inorganic layer 40, the third inorganic layer 70 and the fourth inorganic layer 90 have a thickness of 1 μm-2 μm, respectively.

Specifically, the material for the first inorganic layer 20, the second inorganic layer 40, the third inorganic layer 70 and the fourth inorganic layer 90 comprises at least one of silicon nitride ($SiN_x$), silicon oxide ($SiO_x$), and aluminum oxide ($Al_2O_3$).

Specifically, the first organic layer 30 and the second organic layer 80 have a thickness of 1 μm-10 μm, respectively.

Preferably, the material for the first organic layer 30 and the second organic layer 80 comprises at least one of polyacrylamide, polyvinylidene fluoride, polyacrylates, and fluorine-containing acrylic block copolymers.

Specifically, in the OLED display, the first inorganic layer 20, the second inorganic layer 40, the third inorganic layer 70 and the fourth inorganic layer 90 serve to insulate from the humidity and oxygen.

Specifically, the first organic layer 30 and the second organic layer 80 serve to flatten the surface of the OLED substrate 10 and release the stress to realize the flexible display.

Preferably, the hydrophobic thin film 50 is an ultra hydrophobic thin film forming a surface contact angle greater than 150° with water.

Preferably, the material for the hydrophobic thin film 50 comprises polytetrafluoroethylene (Teflon).

Specifically, the hydrophobic thin film 50 has a thickness of 10 nm to 1000 nm.

Specifically, the microlens array 60 comprises a plurality of microlenses 61 arranged in an array, the microlens 61 has a spherical or ellipsoidal shape.

Preferably, the material for the microlens 61 comprises polycarbonate (PC).

Specifically, the hydrophobic thin film 50 comprises a pixel area 51 corresponding to the OLED device 13 and a non-pixel area 52 other than the pixel area. Preferably, the microlens array 60 is formed only on the pixel area 51 of the hydrophobic film 50.

The above OLED display device adds a hydrophobic thin film 50 in the thin film encapsulation structure of the OLED device 13, and forms a microlens array 60 comprising a plurality of microlenses 61 arranged in an array. The contact angle of the microlens is larger to enhance the optical coupling efficiency of the microlens array 60, as well as light-emission efficiency of OLED device 13.

In summary, the present invention provides a manufacturing method for OLED display, by adding a hydrophobic thin film in the thin film encapsulation structure of the OLED device, printing the droplets of the microlens material onto the hydrophobic thin film, curing to form a microlens array comprising a plurality of microlenses arranged in an array. The method is not only simple, but also can be performed by existing packaging equipment economically. Moreover, the contact angle of the microlens formed by curing the printed microlens material droplets on the hydrophobic thin film is large to enhance the optical coupling efficiency of the microlens array, as well as light-emission efficiency of OLED device. The present invention provides an OLED display device by adding a hydrophobic thin film in the thin film encapsulation structure of the OLED device, and forming a microlens array layer comprising a plurality of microlenses arranged in an array. The contact angle of the microlens formed by curing the printed microlens material droplets on the hydrophobic thin film is larger to enhance the optical coupling efficiency of the microlens array, as well as light-emission efficiency of OLED device.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for organic light-emitting diode (OLED) display, which comprises the steps of:

Step 1: providing an OLED substrate, the OLED substrate comprising: a base substrate, a thin film transistor (TFT) layer disposed on the base substrate, and an OLED device disposed on the TFT layer;

forming a first inorganic layer on the OLED device and the TFT layer, forming a first organic layer on the first inorganic layer, and forming a second inorganic layer on the first organic layer;

Step 2: forming a hydrophobic thin film on the second inorganic layer, and forming a microlens array on the hydrophobic thin film;

wherein the hydrophobic thin film is directly formed on a surface of the second inorganic layer and comprises a pixel area corresponding to the OLED device and non-pixel area other than the pixel area, and wherein the microlens array is formed in the pixel area of the hydrophobic thin film only.

2. The manufacturing method for OLED display as claimed in claim 1, wherein the material for the hydrophobic thin film comprises polytetrafluoroethylene; the hydrophobic thin film has a thickness of 10 nm to 1000 nm; and in the step 2, a pulsed laser deposition apparatus is used to form the hydrophobic thin film.

3. The manufacturing method for OLED display as claimed in claim 1, wherein the microlens array comprises a plurality of microlenses arranged in an array, the microlens has a spherical or ellipsoidal shape; the material for the microlens comprises polycarbonate; and in Step 2, an ink-jet printing apparatus is used to print a plurality of microlens material droplets arranged in an array on the hydrophobic thin film, the droplets are cured to form a plurality of microlenses to form the microlens array.

4. The manufacturing method for OLED display as claimed in claim 1, further comprising: Step 3: forming a third inorganic layer on the microlens array and the hydrophobic thin film.

5. The manufacturing method for OLED display as claimed in claim 4, further comprising: Step 4: forming a plurality of second organic layers and a plurality of fourth inorganic layers on the third inorganic layer;

the plurality of second organic layers and the plurality of fourth inorganic layers being disposed alternatingly and the layer contacting the third inorganic layer being a second organic layer;

the material for the first inorganic layer, the second inorganic layer, the third inorganic layer and the fourth inorganic layer comprising at least one of silicon nitride, silicon oxide, and aluminum oxide;

the first inorganic layer, the second inorganic layer, the third inorganic layer and the fourth inorganic layer having a thickness of 1 µm-2 µm;

the first organic layer and the second organic layer having a thickness of 1 µm-10 µm.

6. An organic light-emitting diode (OLED) display, which comprises: a base substrate, a thin film transistor (TFT) layer disposed on the base substrate, and an OLED device disposed on the TFT layer; a first inorganic layer disposed on the OLED device and the TFT layer, a first organic layer disposed on the first inorganic layer, a second inorganic layer disposed on the first organic layer, a hydrophobic thin film disposed on the second inorganic layer, and a microlens array disposed on the hydrophobic thin film;

wherein the hydrophobic thin film is directly formed on a surface of the second inorganic layer and comprises a pixel area corresponding to the OLED device and non-pixel area other than the pixel area, and wherein the microlens array is formed in the pixel area of the hydrophobic thin film only.

7. The OLED display as claimed in claim 6, wherein the material for the hydrophobic thin film comprises polytetrafluoroethylene; the hydrophobic thin film has a thickness of 10 nm to 1000 nm.

8. The OLED display as claimed in claim 6, wherein the microlens array comprises a plurality of microlenses arranged in an array, the microlens has a spherical or ellipsoidal shape; the material for the microlens comprises polycarbonate.

9. The OLED display as claimed in claim 6, further comprising: a third inorganic layer disposed on the microlens array and the hydrophobic thin film.

10. The OLED display as claimed in claim 9, further comprising: a plurality of second organic layers and a plurality of fourth inorganic layers disposed on the a third inorganic layer; the plurality of second organic layers and the plurality of fourth inorganic layers being disposed alternatingly and the layer contacting the third inorganic layer being a second organic layer;

the material for the first inorganic layer, the second inorganic layer, the third inorganic layer and the fourth inorganic layer comprising at least one of silicon nitride, silicon oxide, and aluminum oxide;

the first inorganic layer, the second inorganic layer, the third inorganic layer and the fourth inorganic layer having a thickness of 1 µm-2 µm;

the first organic layer and the second organic layer having a thickness of 1 µm-10 µm.

11. A manufacturing method for organic light-emitting diode (OLED) display, which comprises the steps of:

Step 1: providing an OLED substrate, the OLED substrate comprising: a base substrate, a thin film transistor (TFT) layer disposed on the base substrate, and an OLED device disposed on the TFT layer;

forming a first inorganic layer on the OLED device and the TFT layer, forming a first organic layer on the first inorganic layer, and forming a second inorganic layer on the first organic layer;

Step 2: forming a hydrophobic thin film on the second inorganic layer, and forming a microlens array on the hydrophobic thin film;

wherein the hydrophobic thin film is directly formed on a surface of the second inorganic layer and comprises a pixel area corresponding to the OLED device and non-pixel area other than the pixel area, and wherein the microlens array is formed in the pixel area of the hydrophobic thin film only;

wherein the material for the hydrophobic thin film comprising polytetrafluoroethylene; the hydrophobic thin film having a thickness of 10 nm to 1000 nm; and in the step 2, a pulsed laser deposition apparatus is used to form the hydrophobic thin film;

wherein the microlens array comprises a plurality of microlenses arranged in an array, the microlens having a spherical or ellipsoidal shape; the material for the microlens comprising polycarbonate; and in Step 2, an ink-jet printing apparatus being used to print a plurality of microlens material droplets arranged in an array on the hydrophobic thin film, the droplets being cured to form a plurality of microlenses to form the microlens array.

12. The manufacturing method for OLED display as claimed in claim 11, further comprising: Step 3: forming a third inorganic layer on the microlens array and the hydrophobic thin film.

13. The manufacturing method for OLED display as claimed in claim 12, further comprising: Step 4: forming a plurality of second organic layers and a plurality of fourth inorganic layers on the third inorganic layer;

the plurality of second organic layers and the plurality of fourth inorganic layers being disposed alternatingly and the layer contacting the third inorganic layer being a second organic layer;

the material for the first inorganic layer, the second inorganic layer, the third inorganic layer and the fourth inorganic layer comprising at least one of silicon nitride, silicon oxide, and aluminum oxide;

the first inorganic layer, the second inorganic layer, the third inorganic layer and the fourth inorganic layer having a thickness of 1 μm-2 μm;

the first organic layer and the second organic layer having a thickness of 1 μm-10 μm.

* * * * *